United States Patent
Nabeshima et al.

(10) Patent No.: US 7,977,767 B2
(45) Date of Patent: Jul. 12, 2011

(54) SPIRAL PLANAR INDUCTOR AND MANUFACTURING METHOD THEREOF

(75) Inventors: Yutaka Nabeshima, Osaka (JP); Masaoki Kajiyama, Osaka (JP); Tomohiro Matsunaga, Kyoto (JP); Hidenori Iwadate, Hyogo (JP)

(73) Assignee: Panasonic Corporation, Osaka (JP)

( * ) Notice: Subject to any disclaimer, the term of this patent is extended or adjusted under 35 U.S.C. 154(b) by 258 days.

(21) Appl. No.: 12/332,720

(22) Filed: Dec. 11, 2008

(65) Prior Publication Data

US 2009/0160018 A1 Jun. 25, 2009

(30) Foreign Application Priority Data

Dec. 20, 2007 (JP) .................................. 2007-329205

(51) Int. Cl.
*H01L 27/00* (2006.01)
(52) U.S. Cl. ........ 257/531; 257/536; 257/622; 257/381; 257/758; 257/E21.022; 257/E21.52; 257/E23; 438/238; 438/381; 438/26; 438/3; 438/108; 438/106; 438/622
(58) Field of Classification Search .................. 257/531, 257/E21.001, E21.022, E21.52, 759, 536, 257/758; 438/3, 238, 381, 55, 26, 106, 622
See application file for complete search history.

(56) References Cited

U.S. PATENT DOCUMENTS

| | | | |
|---|---|---|---|
| 4,703,383 A | 10/1987 | Katou et al. | |
| 5,065,270 A | 11/1991 | Koyanagi et al. | |
| 5,446,311 A | 8/1995 | Ewen et al. | |
| 6,246,541 B1 | 6/2001 | Furuichi et al. | |
| 6,847,066 B2 | 1/2005 | Tahara et al. | |
| 7,087,977 B2 | 8/2006 | Nakayama et al. | |
| 7,217,987 B2 | 5/2007 | Nakayama et al. | |
| 7,791,165 B2 * | 9/2010 | Tanaka .......................... | 257/531 |
| 2005/0098851 A1 | 5/2005 | Nakayama et al. | |
| 2007/0222550 A1 * | 9/2007 | Fujiwara et al. .............. | 336/200 |

FOREIGN PATENT DOCUMENTS

| | | |
|---|---|---|
| JP | 2004-207602 | 7/2004 |
| JP | 3577222 | 7/2004 |
| JP | 2005-268490 | 9/2005 |

OTHER PUBLICATIONS

Dunn, J.S. et al., "Foundation of rf CMOS and SiGe BiCMOS technologies," IBM J. Res. & Dev., vol. 47, No. 2/3, Mar./May 2003.
Burghartz, J.N. et al., "Novel Substrate Contact Structure for High-Q Silicon-Integrated Spiral Inductors," IBM T.J. Watson Research Center, IEEE, 1997.
Burghartz, Joachim N., " Progress in RF Inductors on Silicon—Understanding Substrate Losses," IBM Research Division, T.J. Watson Research Center, IEEE 1998.
Coolbaugh, D. et al., "Advanced Passive Devices for Enhanced Integrated RF Circuit Performance," IEEE Radio Frequency Integrated Circuits Symposium, 2002.
Harame D. et al., "Imagine the Future in Telecommunications Technology," 2003.

* cited by examiner

*Primary Examiner* — Wael M Fahmy
*Assistant Examiner* — Marc Armand
(74) *Attorney, Agent, or Firm* — McDermott Will & Emery LLP

(57) ABSTRACT

An inductor includes an inductor wiring made of a metal layer and having a spiral planar shape. In a cross-sectional shape in a width direction of the inductor wiring, the inductor wiring has a larger film thickness at least in its inner side end than in its middle part.

8 Claims, 8 Drawing Sheets

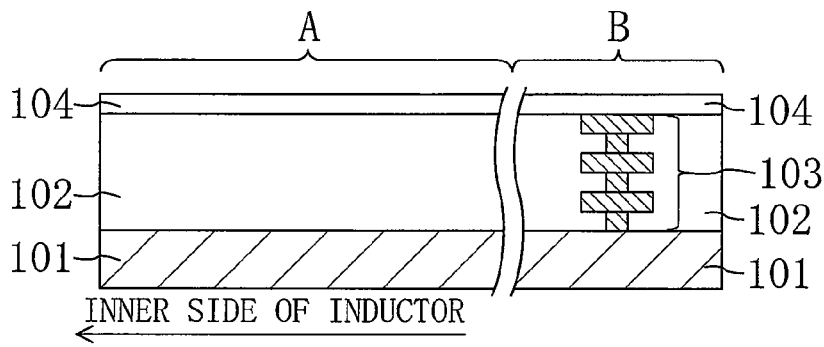
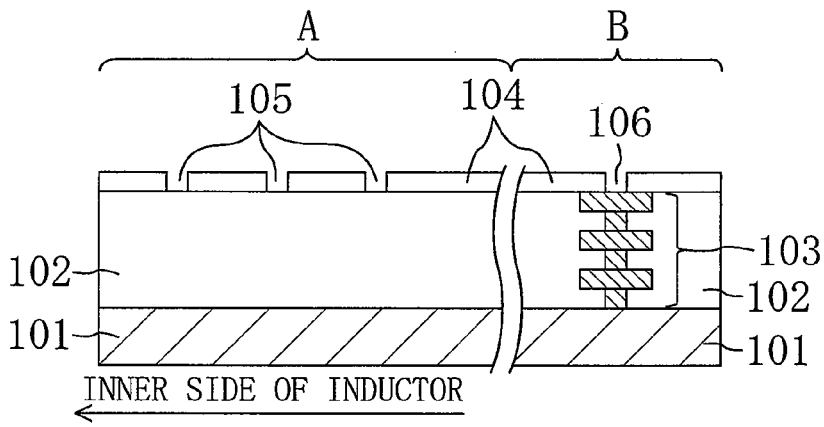
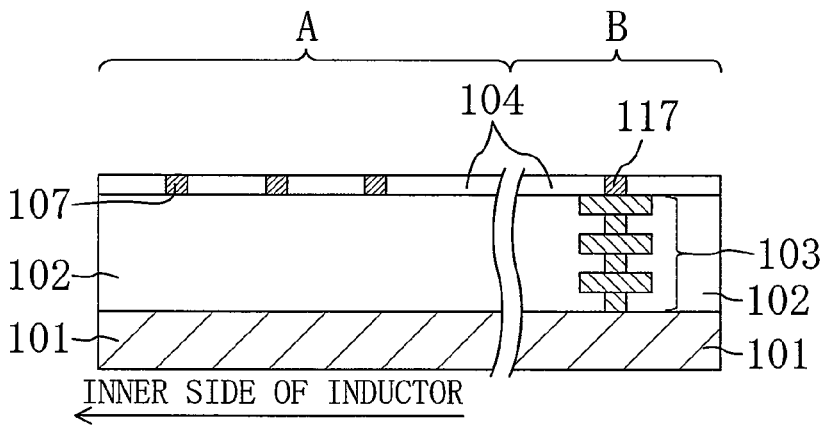
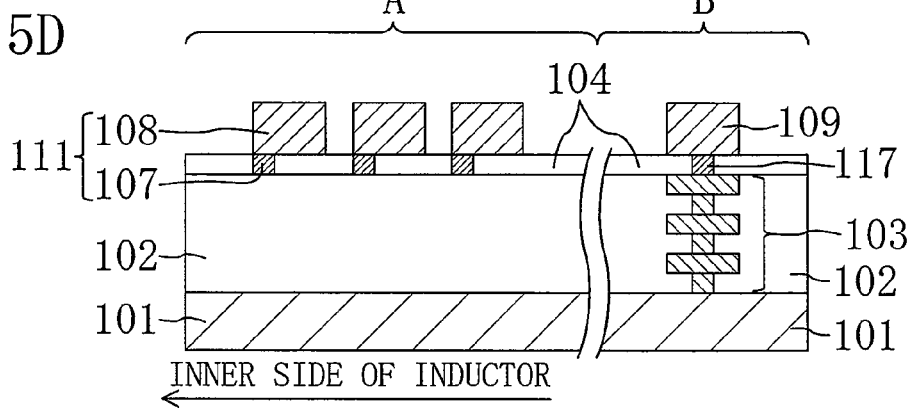

SPIRAL PLANAR INDUCTOR AND MANUFACTURING METHOD THEREOF

CROSS-REFERENCE TO RELATED APPLICATIONS

This application claims priority under 35 U.S.C. §119(a) on Japanese Patent Application No. 2007-329205 filed on Dec. 20, 2007, the entire contents of which are hereby incorporated by reference.

BACKGROUND OF THE INVENTION

1. Field of the Invention

The present invention generally relates to an inductor and a manufacturing method thereof. More particularly, the present invention relates to an inductor having a spiral metal layer on an insulating film formed on a semiconductor substrate and a manufacturing method thereof.

2. Related Art

With recent popularization of cellular phones and PDAs (Personal Digital Assistances), there has been a growing demand for reduction in size of high frequency circuits having a wireless interface. Although passive elements such as an inductor used to be mounted outside a semiconductor device, such as on a printed circuit board portion (that is, passive elements used to be external parts), they have been increasingly mounted within a semiconductor device. An inductor is a part that is required for application to RFIC (Radio Frequency Integrated Circuit) design such as a LNA (Low Noise Amplifier), a PA (Power Amplifier), and an RF (Radio Frequency) oscillator. It is relatively easy to form a resistive element and a capacitive element within a chip. However, it is not necessarily easy to form an inductor within a chip because there are various inductor structures for causing inductivity.

Related art will now be described with reference to FIGS. 7A and 7B. FIG. 7A is a plan view of a spiral inductor. FIG. 7B is a cross-sectional view taken along line VIIb-VIIb' in FIG. 7A.

As shown in FIG. 7A, an inductor 20 is formed by a spiral coil-shaped inductor wiring 11. An outer terminal 11a of the inductor 20 is connected to a via 12 and a wiring 14 and an inner terminal 11b of the inductor 20 is connected to a via 13 and a wiring 15. The inductor wiring 11 is thus electrically extended to the outside. As shown in FIG. 7B, the inductor 20 (inductor wiring 11) is provided in an interlayer insulating film 10 formed on a semiconductor substrate 1, and the inductor wiring 11 has a rectangular cross section when cut in a width direction.

Characteristics of a spiral inductor will now be described. Q-factor (quality factor) is commonly used as an index indicating inductor characteristics. For example, in a series resonant LC circuit, Q-factor is determined by dividing an inductor value at a resonance frequency by a series resistance of the circuit as shown by the formula (1):

$$Q = \omega L / R \tag{1}$$

where $\omega$ is $2\pi f$, $\pi$ is a ratio of the circumference of a circle to its diameter, f is a frequency, L is an inductance value, and R is a resistance value.

It is considered that a higher Q-factor inductor has better electric characteristics. A higher Q-factor inductor also contributes to reduction in power consumption of a circuit.

FIG. 8 shows typical Q-characteristics (change in Q-factor with respect to a frequency) of an inductor. As shown in FIG. 8, Q-factor at first increases with increase in frequency. As the frequency becomes higher, however, Q-factor decreases due to a capacitive loss by capacitive coupling between the inductor and a substrate. The Q-characteristics therefore have a convex wave shape.

It can be seen from the formula (1) that it is effective to reduce a serial resistance component of an inductor and to suppress a capacitive loss in order to increase Q-factor.

An example of such related art is disclosed in Japanese Laid-Open Patent Publication No. 2004-207602 (especially page 28, FIG. 25).

SUMMARY OF THE INVENTION

However, the conventional structure described above has the following problems.

First, as a driving frequency becomes higher, a current tends to concentrate on a region near a surface of an inductor wiring (the top surface, the bottom surface, and both side surfaces if the inductor wiring has a rectangular cross section like the inductor wiring 11 of FIG. 7B) due to the skin effect. Moreover, a magnetic field is generated during power-supply operation of the inductor. In the case of a spiral inductor, a magnetic flux density is therefore higher in the inside of the inductor (i.e., a region within the inductor) than in the outside of the inductor (i.e., a region outside the inductor), and a current tends to concentrate on the inner side of the inductor wiring. Such current concentration on the inner side of the inductor wiring increases a substantial series resistance component and therefore reduces Q-factor of the inductor.

In the case where an inductor wiring is formed by a CMP (Chemical Mechanical Polishing) method in an inductor manufacturing process, the inductor wiring has a reduced film thickness in its middle part due to dishing if the inductor wiring has a wide width (20 µm or more). Such a reduced film thickness in the middle part of the inductor wiring also increases the serial resistance component and thus decreases Q-factor of the inductor.

The invention made by the inventors in view the above problems will now be described. More specifically, description will now be given to an improved Q-factor inductor capable of preventing increase in substantial series resistance component within an inductor wiring and capable of reducing process variation in wiring film thickness, and a manufacturing method thereof.

An inductor according to the present invention includes an inductor wiring made of a metal layer and having a spiral planar shape. In a cross-sectional shape in a width direction of the inductor wiring, the inductor wiring has a larger film thickness at least in its inner side end than in its middle part. The inductor wiring may be formed on an insulating film formed on a substrate.

In other words, the spiral planar shape is formed by the inductor wiring having a larger film thickness at least in its one end than in its middle part in the cross section in the width direction.

Preferably, in the cross-sectional shape in the width direction of the inductor wiring, the inductor wiring has a larger thickness in its inner side end than in its outer side end.

With this structure, even if a current concentrates on a region near the surface on the inner side of the inductor wiring due to the influence of a magnetic field generated during power-supply operation of the inductor, the skin effect caused at a high driving frequency, and the like, the increased thickness in this region can suppress increase in substantial series resistance component.

It is also preferable that, in the cross-sectional shape in the width direction of the inductor wiring, the inductor wiring has a larger thickness in both its inner side end and its outer side end than in its middle part.

With this structure, even if a current concentrates on a region near the surface of the inner side and outer side of the inductor wiring due to the influence of a magnetic field generated during power-supply operation of the inductor, the skin effect caused at a high driving frequency, and the like, the increased thickness in this region can suppress increase in substantial series resistance component.

A method for manufacturing an inductor according to the present invention includes the steps of: (a) forming an insulating film on a semiconductor substrate; (b) forming a first groove having a spiral planar shape in the insulating film; (c) forming a first inductor pattern by embedding a first metal layer in the first groove; and (d) forming on the insulating film a second inductor pattern made of a second metal layer, extending along a top surface of the first inductor pattern, and having a larger width than that of the first inductor pattern. In the step (d), an inductor wiring formed by the first inductor pattern and the second inductor pattern is formed by positioning an inner side end of the second inductor pattern on the first inductor pattern.

An inductor of the present invention including an inductor wiring having a larger thickness in its inner side end can be manufactured according to the inductor manufacturing method of the present invention. As described above, such an inductor can suppress increase in substantial series resistance component during operation.

Moreover, in the above inductor manufacturing method, the first inductor pattern formed by embedding the first metal layer in the first groove and the second inductor pattern having a larger width than that of the first groove are formed in separate steps. Forming the second inductor pattern by an etching method or the like eliminates the need to limit the width of the inductor wiring to prevent dishing (recess formation) in a CMP process. As a result, process variation in film thickness can be reduced.

Moreover, the first groove for forming the first inductor pattern is formed simultaneously with a via hole, and the second metal layer of the second inductor pattern is formed simultaneously with another wiring. It is therefore not necessary to add a new step to the manufacturing process of the inductor. This prevents increase in manufacturing cost, whereby an inductor can be manufactured inexpensively.

It is also preferable that a second groove is further formed in the step (b) so as to have a spiral planar shape extending in parallel with the first groove, a third inductor pattern is further formed in the step (c) by embedding the first metal layer in the second groove, and an inductor wiring formed by the first inductor pattern, the second inductor pattern, and the third inductor pattern is formed in the step (d) by positioning an outer side end of the second inductor pattern on the third inductor pattern.

In this case, the second inductor pattern is formed so that the first inductor pattern and the third inductor pattern are aligned at the inner side end and the outer side end of the second inductor pattern, whereby the inductor wiring having the spiral planar shape is formed. In other words, the inductor includes an inductor wiring having a larger thickness in its both ends than in its middle part in cross section in a width direction. As a result, an inductor of the present invention can be manufactured which is capable of suppressing increase in substantial series resistance component even if a current concentrates on both ends in the cross section in the width direction of the inductor wiring.

Preferably, the first metal layer and the second metal layer are made of a same metal material. This can reduce the contact resistance between the first metal layer and the second metal layer.

As described above, in the inductor and the manufacturing method thereof according to the present invention, even if a current concentrates on a region near the surface of the inner side end of the inductor wiring due to the influence of a magnetic field generated during power-supply operation of the inductor, the skin effect caused at a high frequency, and the like, increase in substantial series resistance component in this region can be suppressed. Moreover, process variation in film thickness can be reduced. As a result, an inductor having an improved Q-factor can be implemented, and the present invention is therefore useful as an inductor mounted within a semiconductor device of a high frequency integrated circuit, especially an inductor for which improved capability in high frequency operation is required, and a manufacturing method thereof.

BRIEF DESCRIPTION OF THE DRAWINGS

FIGS. 5A, 5B, 5C, and 5D are diagrams illustrating a manufacturing method of an inductor according to a third embodiment of the present invention;

DETAILED DESCRIPTION OF THE PREFERRED EMBODIMENTS

First Embodiment

Figure 1:
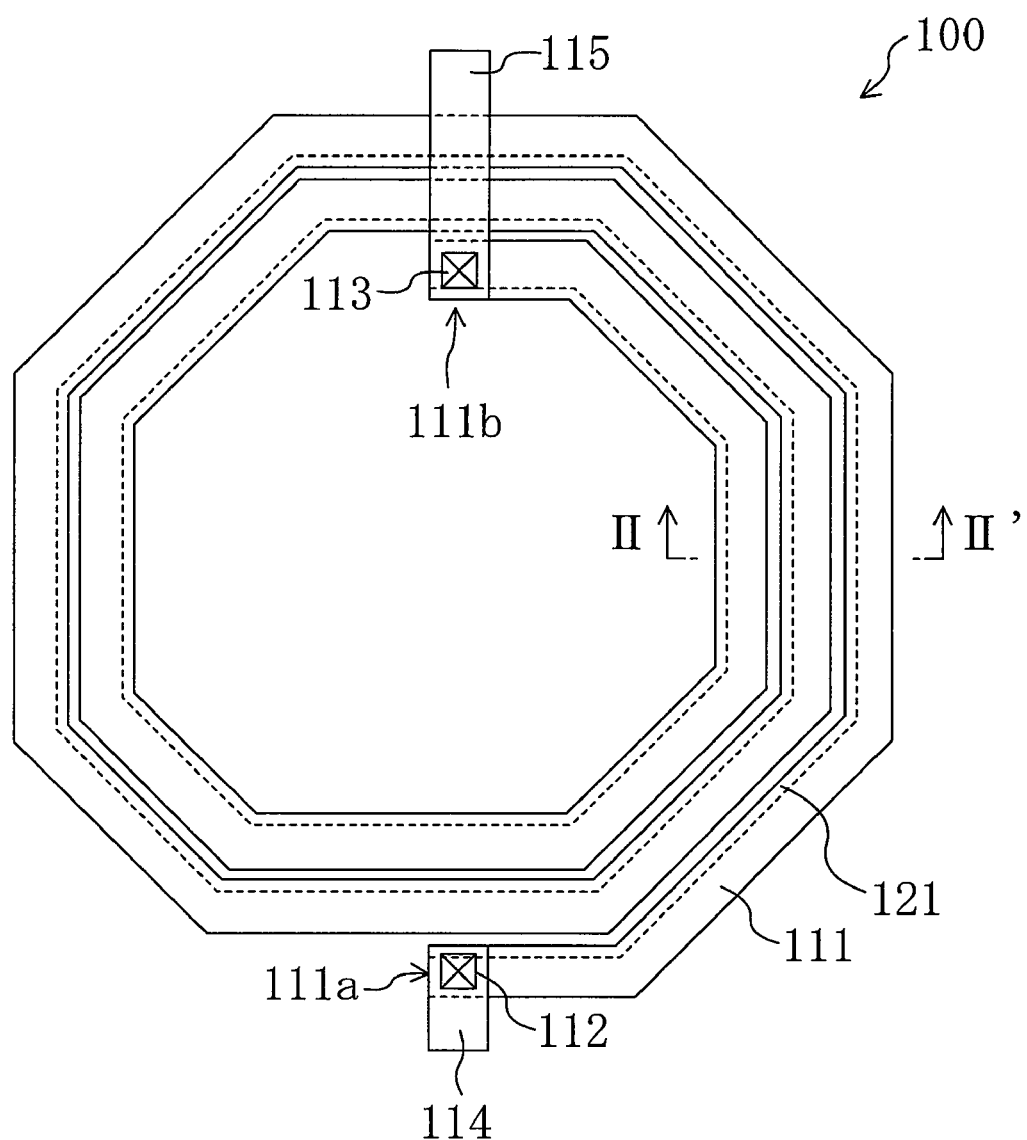
FIG. 1 shows a planar shape of an inductor 100 according to a first embodiment of the present invention.

Hereinafter, an inductor according to a first embodiment of the present invention will be described with reference to the figures. FIG. 1 shows a planar shape of an inductor 100 of the present embodiment.

As shown in FIG. 1, the inductor 100 is formed by a spiral coil-shaped inductor wiring 111. The inductor wiring 111 has an outer terminal 111a at its outer end, and the outer terminal 111a is connected to a wiring 114 through a via 112. Similarly, the inductor wiring 111 has an inner terminal 111b at its inner end, and the inner terminal 111b is connected to a wiring 115 through a via 113.

In a cross section in a width direction of the inductor wiring 111, the inductor wiring 111 has a larger film thickness in its inner side end 121 than in the remaining part of the inductor wiring 111. This structure will now be described.

Figure 2A:
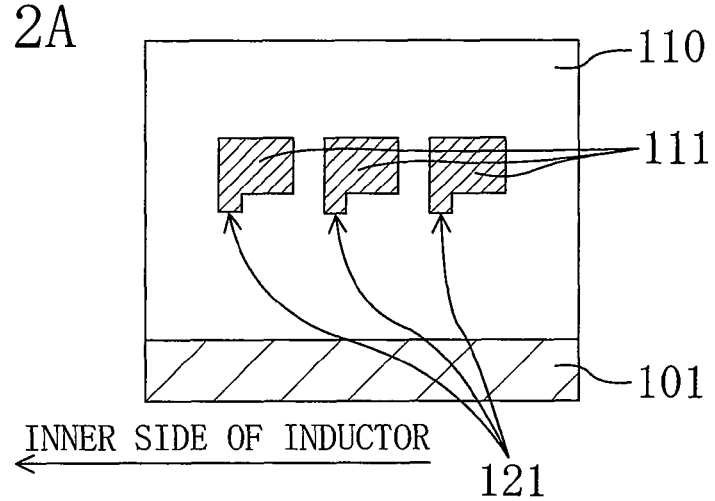
FIGS. 2A, 2B, and 2C show examples of cross-sectional structures of the inductor 100 taken along line II-II' in FIG. 1.
Figure 2B:
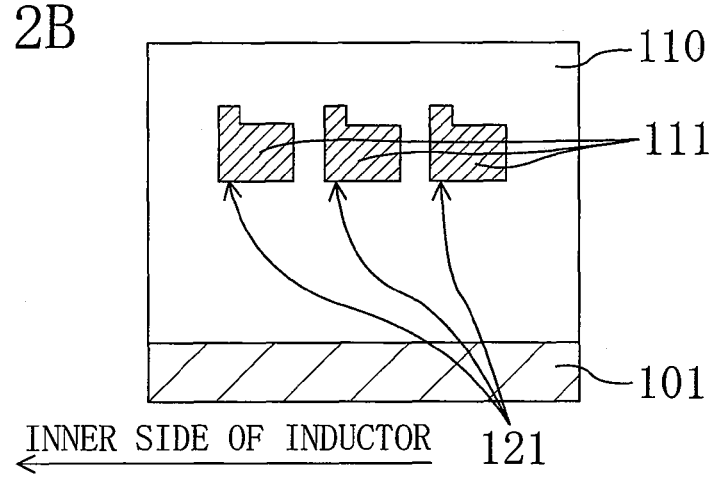
Figure 2C:
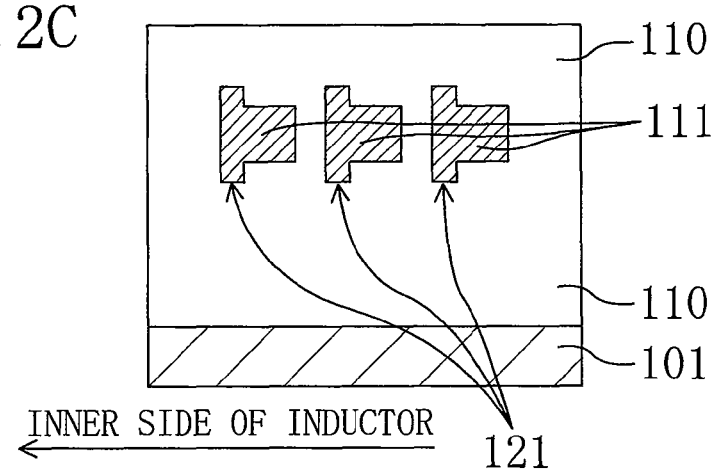

FIGS. 2A through 2C are cross-sectional views taken along line II-II' in FIG. 1 and show examples of three different cross-sectional structures of the inductor 100 having a spiral planar shape as shown in FIG. 1. In each case, the inductor wiring 111 is buried in an interlayer insulating film 110 formed on a semiconductor substrate 101. Since three spiral curves of the inductor wiring 111 are cut in the width direction in FIGS. 2A through 2C, three cross sections of the inductor wiring 111 appear in FIGS. 2A through 2C.

In the cross-sectional shape of the inductor wiring 111 shown in FIG. 2A, the inner side end 121 of the inductor wiring 111 protrudes downward so as to have a larger thickness. In FIG. 2B, the inner side end 121 of the inductor wiring 111 protrudes upward so as to have a larger thickness. In FIG. 2C, the inner side end 121 of the inductor wiring 111 protrudes both downward and upward so as to have a larger thickness.

Note that, in each case, the three cross sections of the inductor wiring 111 have the same shape. However, the present invention is not limited to the structure in which the cross sections of the inductor wiring 111 have the same shape. As described later, these protruding parts are formed by embedding a metal material in a groove formed in an insulating film by a CMP method.

As has been described above, in the inductor 100 of the present embodiment, the inductor wiring 111 has a larger film thickness in its inner side end 121 than in the remaining part (the middle part and the outer side end) of the inductor wiring 111 in the width-direction cross section of the inductor wiring 111. Accordingly, even if a current concentrates on the inner side (near the surface of the inner side end 121) of the inductor 100 in the inductor wiring 111 due to the influence of a magnetic field generated during power-supply operation of the inductor 100, the skin effect caused at a high driving frequency, and the like, increase in substantial series resistance component can be suppressed. An inductor having an improved Q-factor can thus be implemented by this embodiment.

In the cross-sectional shapes described above (FIGS. 2A through 2C), the inner side end 121 and the remaining part of the inductor 100 have a certain film thickness and a stepped portion is provided at the boundary between the inner side end 121 and the remaining part so that the inner side end 121 has a larger thickness. However, the present invention is not limited to this structure. The inductor 100 may have any structure as long as the inductor wiring 111 has a larger film thickness in its inner side than in its outer side in the width-direction cross section of the inductor wiring 111. In the cross-sectional shape of the inductor wiring 111, the inductor wiring 111 may have a continuously increased film thickness from its outer side toward its inner side without any stepped portion.

Second Embodiment

Figure 3:
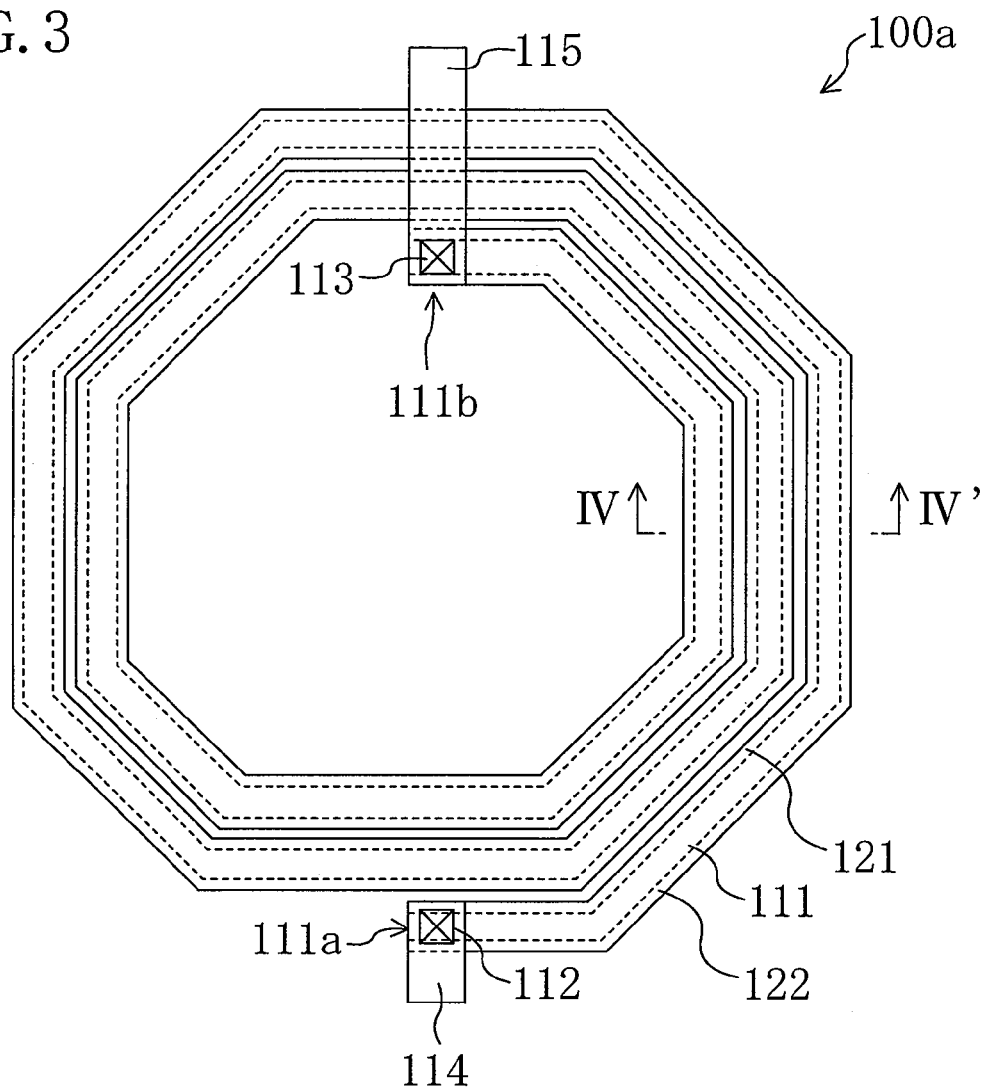
FIG. 3 shows a planar shape of an inductor 100a according to a second embodiment of the present invention.

Hereinafter, an inductor according to a second embodiment of the present invention will be described with reference to the figures. FIG. 3 shows a planar shape of an inductor 100a of this embodiment. In the inductor 100a of FIG. 3, the same elements as those of the inductor 100 of the first embodiment shown in FIG. 1 are denoted by the same reference numerals and characters. The inductor 100a is different from the inductor 100 in the cross-sectional shape in the width direction of the inductor wiring 111. In the inductor 100a, the inductor wiring 111 has a larger film thickness in its inner side end 121 and its outer side end 122 than in the remaining part of the inductor wiring 111 in the width-direction cross section. This structure will now be described.

Figure 4A:
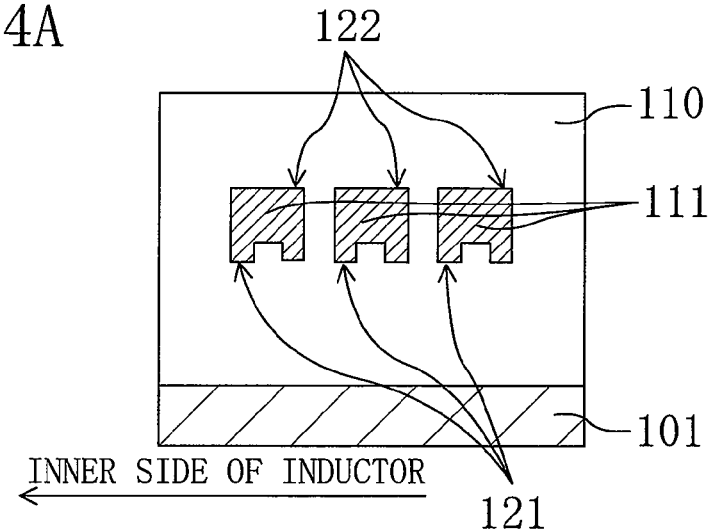
FIGS. 4A, 4B, and 4C show examples of cross-sectional structures of the inductor 100a taken along line IV-IV' in FIG. 3.
Figure 4B:
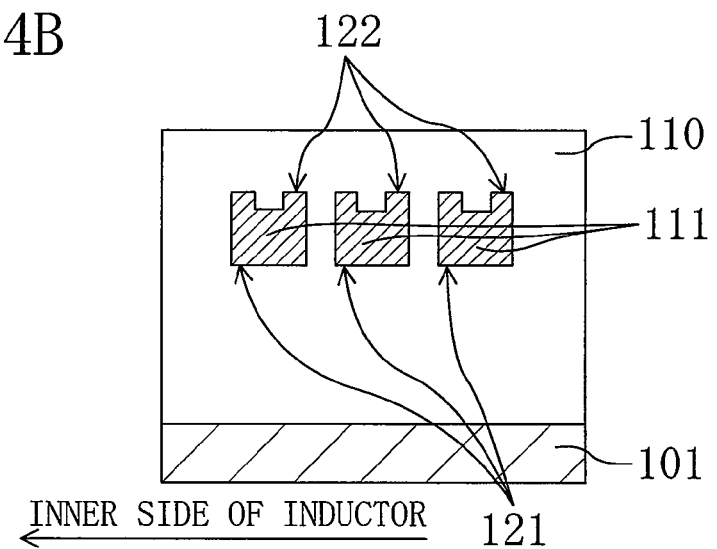
Figure 4C:
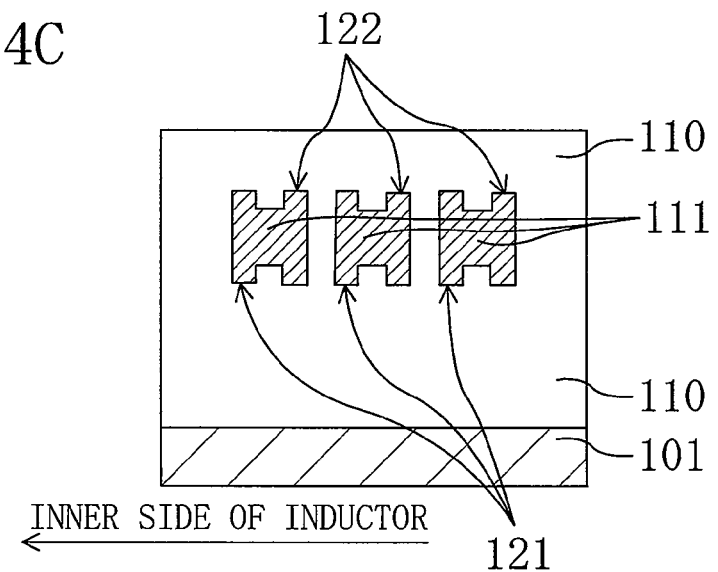

FIGS. 4A through 4C show three examples of the cross section taken along line IV-IV' in FIG. 3.

In the inductor 100 of the first embodiment, the inductor wiring 111 has a larger film thickness in its inner side end 121 than in the remaining part of the inductor wiring 111 in the width-direction cross section of the inductor wiring 111. In the inductor 100a of this embodiment, on the other hand, the inductor wiring 111 has a larger film thickness in its inner side end 121 and its outer side end 122 than in its middle part. In other words, the inductor wiring 111 of this embodiment has a larger film thickness in its both ends than in its middle part in the width-direction cross section of the inductor wiring 111.

More specifically, in FIG. 4A, both ends in the width direction of the inductor wiring 111 (the inner side end 121 and the outer side end 122 of the inductor wiring 111) protrude downward so as to have a larger thickness in the cross-sectional shape of the inductor wiring 111. In FIG. 4B, both ends of the inductor wiring 111 protrude upward so as to have a larger thickness. In FIG. 4C, both ends of the inductor wiring 111 protrude both downward and upward so as to have a larger thickness.

As has been described above, the inductor 100a of the present embodiment is structured so that the inductor wiring 111 has a larger film thickness in its inner side end 121 and its outer side end 122 than in its middle part in the width-direction cross section of the inductor wiring 111. Accordingly, even if a current concentrates on a region near the surface of both ends in the width direction of the inductor wiring 111 due to the influence of a magnetic field generated during power-supply operation of the inductor 100a, the skin effect caused at a high driving frequency, and the like, increase in substantial series resistance component can be suppressed. An inductor having an improved Q-factor can thus be implemented by this embodiment.

In the cross-sectional shapes described above (FIGS. 4A through 4C), the inner side end 121, the outer side end 122, and the middle part of the inductor wiring 111 have a certain film thickness and a stepped portion is provided at the boundary between the inner side end 121 and the middle part and the boundary between the middle part and the outer side end 122, whereby the inductor wiring 111 has a larger film thickness in the inner side end 121 and the outer side end 122 than in the middle part of the inductor wiring 111. However, the present invention is not limited to this structure. The inductor 100a may have any structure as long as the inductor wiring 111 has a larger film thickness in its both ends than in its middle part in the width-direction cross section of the inductor wiring 111. In the cross-sectional shape of the inductor wiring 111, the inductor wiring 111 may have a continuously increased film thickness from its middle part toward its inner side and its outer side without any stepped portion.

Third Embodiment

Hereinafter, a method for manufacturing an inductor according to the present invention will be described as a third embodiment with reference to the figures. FIGS. 5A through 5D are diagrams illustrating a manufacturing process of an inductor having a cross-sectional structure of FIG. 2A as a specific example of an inductor.

First, a structure shown in FIG. 5A is formed. More specifically, an interlayer insulating film 102 is formed on a semiconductor substrate 101, and an insulating film 104 is formed on the interlayer insulating film 102. An inductor portion A for forming an inductor and a wiring portion B for forming a wiring are defined in the semiconductor substrate 101. In the wiring portion B, a lower layer wiring 103 is formed in the interlayer insulating film 102.

The step of FIG. 5B is then performed. In this step, a first groove 105 for forming a first inductor pattern is formed in the insulating film 104 in the inductor portion A. At the same time, a via hole 106 is formed in the insulating film 104 in the wiring portion B.

The first groove 105 is formed so as to have a planar shape corresponding to the inner side end 121 of the inductor wiring 111 shown in FIG. 1.

The step of FIG. 5C is then performed. In this step, a first metal material is embedded in the first groove 105 and the via hole 106 to form a first inductor pattern 107 and a via plug 116 made of a first metal layer.

The step of FIG. 5D is then performed. In this step, a second metal film is deposited on the insulating film 104 including on the first inductor pattern 107 and the via plug 117, and an unnecessary part of the second metal film is removed by a photoetching method. As a result, a second inductor pattern 108 is formed in the inductor portion A and an upper wiring 109 is formed in the wiring portion B.

An inductor wiring 111 (see FIG. 1 and the like) is thus formed by the first inductor pattern 107 and the second inductor pattern 108 extending along the first inductor pattern 107. The second inductor pattern 108 made of the second metal film is formed so as to have a larger width than that of the first inductor pattern 107. The second inductor pattern 108 is also formed so that its inner side end is positioned on the first inductor pattern 107. In the inductor thus formed, the inductor wiring 111 has a larger thickness in the inner side end 121 than in the remaining part of the inductor wiring 111 in the width-direction cross section of the inductor wiring 111.

Another insulating film is then formed over the insulating film 104 so as to cover the inductor wiring 111, whereby the same structure as that shown in FIG. 2A is obtained.

As has been described above, according to the inductor manufacturing method of the present embodiment, the first inductor pattern 107 of the inductor wiring 111, which is a part having an increased film thickness (an increased thickness portion), and the second inductor pattern 108 of the inductor wiring 111, which is the remaining part (a main body portion), are formed in separate steps. The second inductor pattern 108 is formed by a photoetching method or the like. This eliminates the need to limit the width of the inductor wiring to prevent dishing (recess formation) in the CMP process, whereby process variation in film thickness can be reduced.

Moreover, the first groove 105 and the via hole 106 are formed simultaneously, the first inductor pattern 107 and the via plug 117 are formed simultaneously, and the second inductor pattern 108 and the upper wiring 109 are formed simultaneously. It is therefore not necessary to add a new step in order to form an inductor having the structure of the present embodiment. Since the cost for an additional step is not required, an inductor can be manufactured inexpensively.

Fourth Embodiment

Hereinafter, another inductor manufacturing method will be described with reference to the figures as a fourth embodiment of the present invention. FIGS. 6A through 6D are diagrams illustrating a manufacturing process of an inductor having a cross-sectional structure of FIG. 4A as a specific example of an inductor.

Figure 6A:
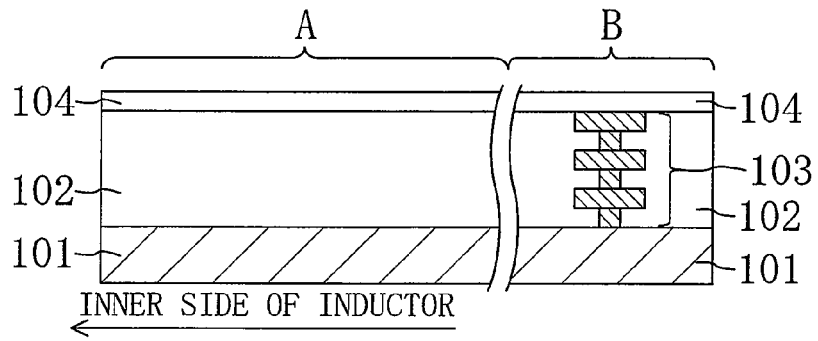
FIGS. 6A, 6B, 6C, and 6D are diagrams illustrating a manufacturing method of an inductor according to a fourth embodiment of the present invention.
Figure 6B:
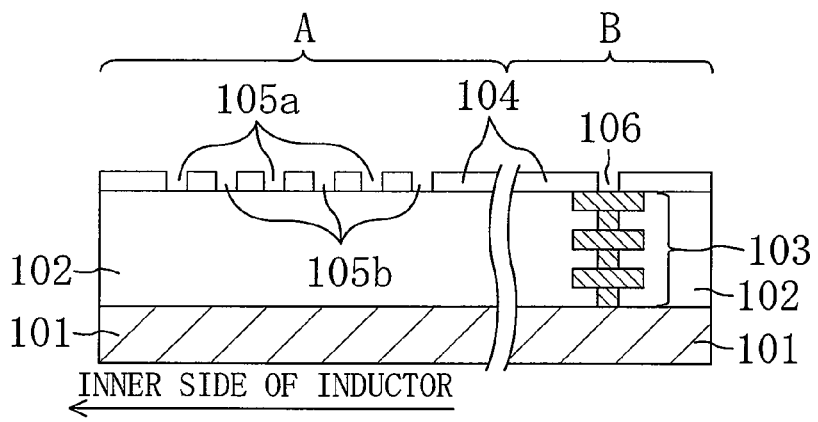

First, a structure shown in FIG. 6A is formed. Since this structure is the same as that of FIG. 5A in the third embodiment, description thereof will be omitted.

The step of FIG. 6A is then performed. In this step, a first groove 105a for forming a first inductor pattern 107a in an insulating film 104 and a second groove 105b for forming a third inductor pattern 107b are formed in an insulating film 104 in an inductor portion A. At the same time, a via hole 106 is formed in the insulating film 104 in a wiring portion B.

The first groove 105a is formed so as to have a planar shape corresponding to the inner side end 121 of the inductor wiring 111 shown in FIG. 3. The second groove 105b is formed so as to have a planar shape corresponding to the outer side end 122 of the inductor wiring 111 shown in FIG. 3. Therefore, the first groove 105a and the second groove 105b form a spiral planar shape doubly extending in parallel with each other.

Figure 6C:
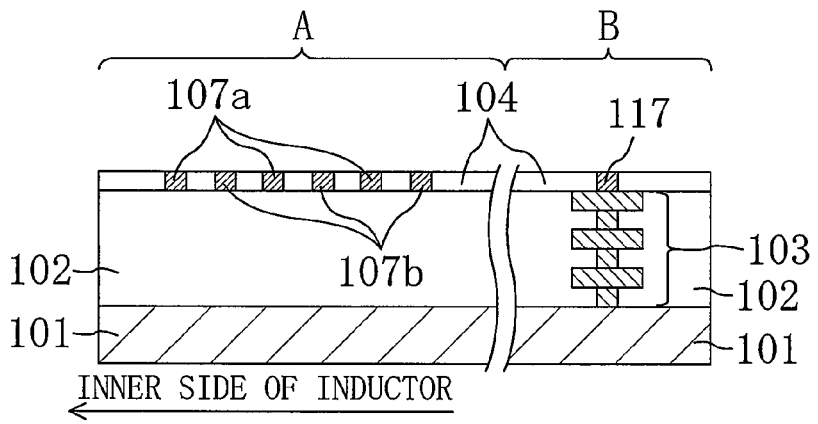

The step shown in FIG. 6C is then performed. A first inductor pattern 107a, a third inductor pattern 107b, and a via plug 117 are formed by embedding a first metal material in the first groove 105a, the second groove 105b, and the via hole 106. The first inductor pattern 107a, the third inductor pattern 107b, and the via plug 117 are thus made of a first-metal layer.

Figure 6D:
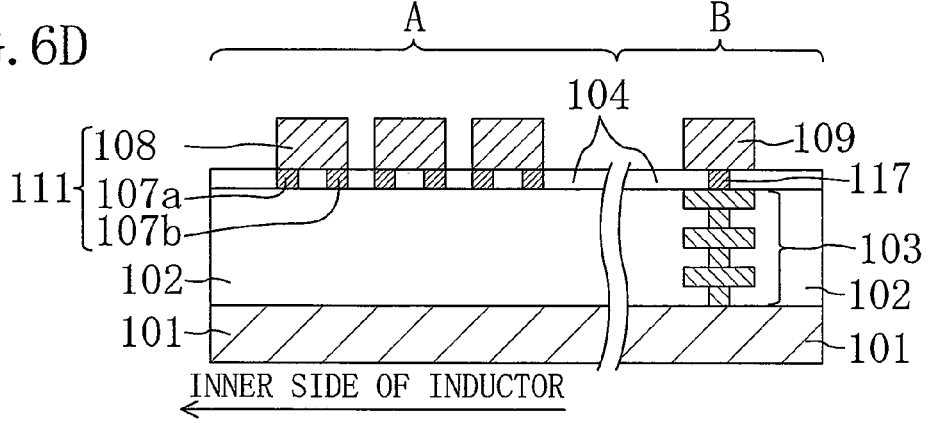
Figures 7A, 7B:
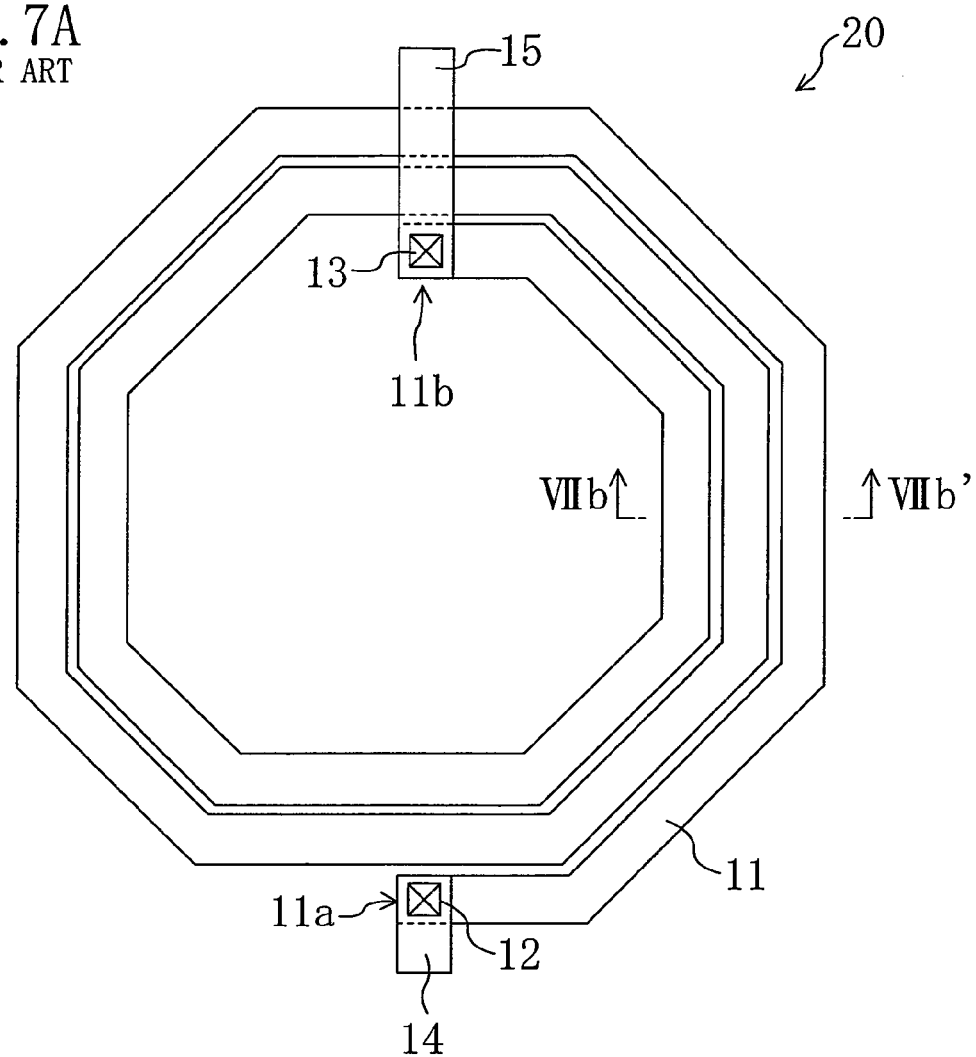
FIG. 7A shows a planar shape of a conventional inductor 20.
FIG. 7B shows a cross-sectional structure taken along line VIIb-VIIb' in FIG. 7A.
Figure 8:
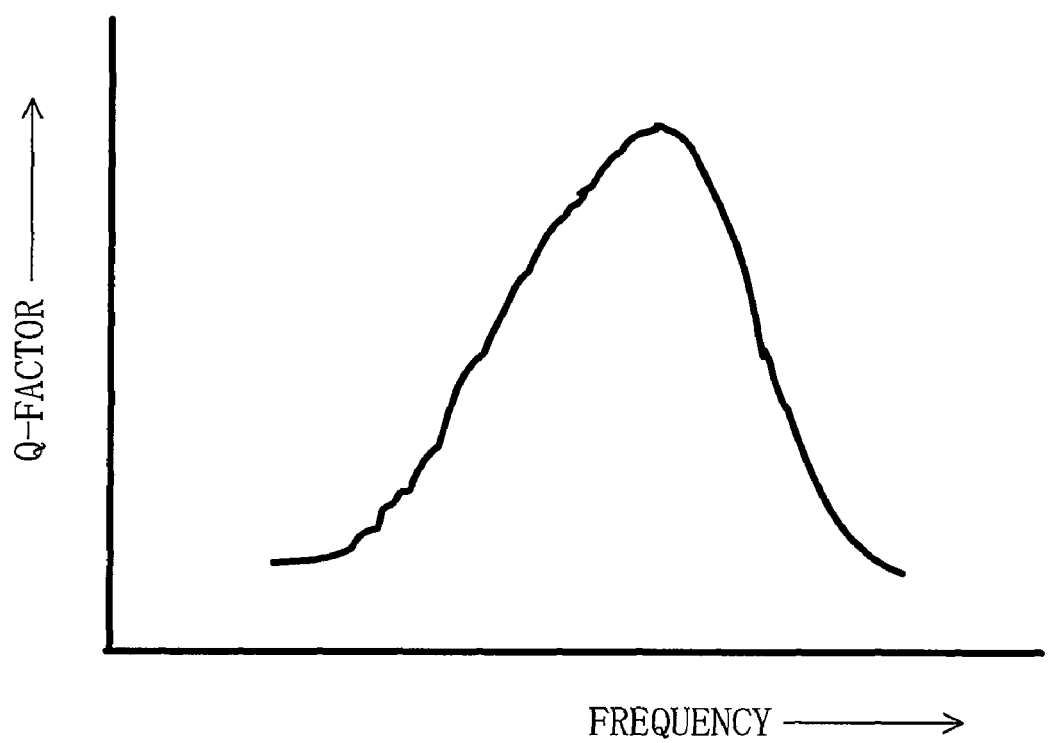
FIG. 8 is a graph showing a relation between Q-factor of an inductor and a frequency.

The step shown in FIG. 6D is then performed. In this step, a second metal film is deposited on the insulating film 104 including on the first inductor pattern 107a, the third inductor pattern 107b, and the via plug 117, and an unnecessary part of the second metal film is removed by a photoetching method. A second inductor pattern 108 is thus formed in the inductor portion A and an upper wiring 109 is formed in the wiring portion B.

An inductor wiring 111 (see FIG. 3 and the like) is thus formed by the first inductor pattern 107a, the third inductor pattern 107b, and the second inductor pattern 108 extending along the first and second inductor patterns 107a and 107b. The second inductor pattern 108 made of the second metal film is formed so as to have a larger width than that of the first inductor pattern 107a and the third inductor pattern 107b. The second inductor pattern 108 is also formed so that the inner side end of the second inductor pattern 108 is positioned on the first inductor pattern 107 and the outer side end of the second inductor pattern 108 is positioned on the third inductor pattern 107b. In the inductor thus formed, the inductor wiring 111 has a larger thickness in the inner side end 121 and the outer side end 122 than in the middle part in the width-direction cross section of the inductor wiring 111.

Another insulating film is then formed over the insulating film 104 so as to cover the inductor wiring 111. The same structure as that shown in FIG. 4A is thus obtained.

As has been described above, according to the inductor manufacturing method of the present embodiment, the first inductor pattern 107a and the third inductor pattern 107b of the inductor wiring 111, which are parts having an increased film thickness (increased thickness portions), and the second inductor pattern 108, which is the remaining part (a main body portion), are formed in separate steps. The second inductor pattern 108 is formed by an etching method or the like. This eliminates the need to limit the width of the inductor wiring to prevent dishing (recess formation) in the CMP process, whereby process variation in film thickness can be reduced.

Moreover, the first and second grooves 105a, 105b and the via hole 106 are formed simultaneously, the first and third inductor pattern 107a, 107b and the via plug 117 are formed simultaneously, and the second inductor pattern 108 and the upper wiring 109 are formed simultaneously. It is therefore not necessary to add a new step in order to form an inductor having the structure of the present embodiment. Since the cost for an additional step is not required, an inductor can be manufactured inexpensively.

Note that, in the third embodiment and the fourth embodiment, the first metal layer and the second metal layer may be made of different metal materials from each other or may be made of the same metal material. Since the use of the same metal material can reduce the contact resistance, it is more desirable to use the same material.

In the third embodiment and the fourth embodiment, there is no limitation on the step of forming the lower layer wiring 103 and the like. Moreover, there is no limitation on materials, formation methods, formation conditions, dimensions, and the like of the semiconductor substrate 101, the interlayer insulating film 102, and other various elements.

Note that in the case where an inductor wiring having a part that protrudes upward so as to have an increased thickness is formed as shown in FIGS. 2B and 2C and FIGS. 4B and 4C, the upward protruding part (increased thickness portion) of the inductor wiring can be formed after the second inductor pattern 108 is formed.

For example, in the third embodiment, another insulating film is formed so as to cover the second inductor pattern 108 after the step of FIG. 5D. The insulating film thus formed is then planarized until the top surface of the second inductor pattern 108 is exposed. Thereafter, insulating film formation, groove formation in the insulating film (above the first inductor pattern 107), and metal material embedding in the groove are sequentially performed in the same manner as that of formation of the first inductor pattern 107. An increased thickness portion is thus formed on the inner side portion of the second inductor pattern 108. The structure shown in FIG. 2C can thus be formed.

The description of the embodiments of the present invention is given above for the understanding of the present invention. It will be understood that the invention is not limited to the particular embodiments described herein, but is capable of various modifications, rearrangements, and substitutions as will now become apparent to those skilled in the art without departing from the scope of the invention. Therefore, it is intended that the following claims cover all such modifications and changes as fall within the true spirit and scope of the invention.

What is claimed is:

1. An inductor, comprising an inductor wiring made of a metal layer and having a spiral planar shape,
    wherein, in a cross-sectional shape in a width direction of the inductor wiring, the inductor wiring has a larger film thickness in its inner side end than in its middle part and its outer side end.

2. The inductor according to claim 1, wherein:
    the inductor wiring includes a first metal layer provided only in the inner side end, and a second metal layer provided in the inner side end, the middle part and the outer side end, and
    in the inner side end, the first layer and the second layer are stacked, and are made of a same metal material.

3. The inductor according to claim 1, wherein:
    the inductor wiring includes a first metal layer provided only in the inner side end, and a second metal layer provided in the inner side end, the middle part and the outer side end, and
    in the inner side end, the first layer and the second layer are stacked, and are made of different metal materials from each other.

4. A method for manufacturing an inductor, comprising the steps of:
    (a) forming an insulating film on a semiconductor substrate;
    (b) forming a first groove having a spiral planar shape in the insulating film;
    (c) forming a first inductor pattern by embedding a first metal layer in the first groove; and
    (d) forming on the insulating film a second inductor pattern made of a second metal layer, extending along a top surface of the first inductor pattern, and having a larger width than that of the first inductor pattern, wherein:
    in the step (d), an inductor wiring formed by the first inductor pattern and the second inductor pattern is formed by positioning an inner side end of the second inductor pattern on the first inductor pattern, and
    in a cross-sectional shape in a width direction of the inductor wiring, the inductor wiring has a larger film thickness in its inner side end than in its middle part and its outer side end.

5. The method according to claim 4, wherein a second groove is further formed in the step (b) so as to have a spiral planar shape extending in parallel with the first groove, a third inductor pattern is further formed in the step (c) by embedding the first metal layer in the second groove, and an inductor wiring formed by the first inductor pattern, the second inductor pattern, and the third inductor pattern is formed in the step (d) by positioning an outer side end of the second inductor pattern on the third inductor pattern.

6. The method according to claim 4, wherein the first metal layer and the second metal layer are made of a same metal material.

7. The method according to claim 4, wherein
    the first metal layer and the second metal layer are made of different metal materials from each other.

8. The method according to claim 5, wherein the first metal layer and the second metal layer are made of a same metal material.

* * * * *